United States Patent
Asano

(10) Patent No.: US 7,576,537 B2
(45) Date of Patent: Aug. 18, 2009

(54) RF PULSE APPLYING METHOD WITH AN MRI APPARATUS WHICH REDUCES VERTICAL MAGNETIZATION

(75) Inventor: Kenji Asano, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 119 days.

(21) Appl. No.: 11/613,583

(22) Filed: Dec. 20, 2006

(65) Prior Publication Data

US 2007/0145976 A1  Jun. 28, 2007

(30) Foreign Application Priority Data

Dec. 26, 2005 (JP) .............................. 2005-372200

(51) Int. Cl.
*G01V 3/00* (2006.01)
(52) U.S. Cl. ...................... 324/307; 324/309; 324/314
(58) Field of Classification Search ......... 324/300–322; 600/410–422
See application file for complete search history.

(56) References Cited

U.S. PATENT DOCUMENTS

| 5,256,967 | A  | * | 10/1993 | Foo et al. ............... 324/311 |
| 5,347,216 | A  | * | 9/1994  | Foo ......................... 324/309 |
| 6,307,368 | B1 | * | 10/2001 | Vasanawala et al. ...... 324/309 |
| 6,452,387 | B1 | * | 9/2002  | Hargreaves et al. ........ 324/300 |
| 6,587,708 | B2 | * | 7/2003  | Venkatesan et al. ........ 600/419 |
| 6,737,865 | B2 |   | 5/2004  | Asano et al. |
| 6,806,709 | B2 |   | 10/2004 | Markl et al. |
| 7,116,105 | B1 |   | 10/2006 | Zhang |
| 7,253,620 | B1 | * | 8/2007  | Derbyshire et al. ......... 324/307 |
| 7,443,162 | B2 | * | 10/2008 | Deimling .................. 324/307 |
| 2002/0149366 | A1 |   | 10/2002 | Asano et al. |
| 2003/0030435 | A1 | * | 2/2003  | Venkatesan et al. ......... 324/306 |
| 2003/0160616 | A1 |   | 8/2003  | Asano et al. |
| 2004/0113613 | A1 |   | 6/2004  | Markl et al. |
| 2005/0148858 | A1 | * | 7/2005  | Hargreaves ................. 600/410 |
| 2007/0035299 | A1 | * | 2/2007  | Deimling .................... 324/309 |
| 2007/0145976 | A1 | * | 6/2007  | Asano ........................ 324/307 |
| 2007/0225591 | A1 | * | 9/2007  | Derbyshire et al. ......... 600/410 |

FOREIGN PATENT DOCUMENTS

JP  2004329268  11/2004

* cited by examiner

*Primary Examiner*—Brij B. Shrivastav
*Assistant Examiner*—Tiffany A Fetzner
(74) *Attorney, Agent, or Firm*—Armstrong Teasdale LLP

(57) ABSTRACT

The present invention aims to receive a signal of tissue long in T2 at a relatively high level and suppress artifacts. When a magnetic resonance frequency of a component intended for measurement is assumed to be $\Omega$ and the frequency corresponding to a repetition time TR is assumed to be $\omega_0$, an RF pulse obtained by modulating a chemical shift SAT pulse for reducing a signal of a frequency $\Omega$ with $\cos(\omega_0 \cdot t)$ is applied as a leading pulse Po and thereafter a pulse sequence of Balanced SSFP is applied. Since a signal leading to the occurrence of artifacts is reduced owing to the effect of the leading pulse, the artifacts can be suppressed. Since a transient state is long in the same manner as conventional, such a signal of tissue long in T2 can be received at the relatively high level and contrast can be kept high by executing data acquisition in the transient state.

20 Claims, 3 Drawing Sheets

RF PULSE APPLYING METHOD WITH AN MRI APPARATUS WHICH REDUCES VERTICAL MAGNETIZATION

CROSS REFERENCE TO RELATED APPLICATIONS

This application claims the benefit of Japanese Application No. 2005-372200 filed Dec. 26, 2005.

BACKGROUND OF THE INVENTION

The present invention relates to an RF (Radio Frequency) pulse applying method and an MRI (Magnetic Resonance Imaging) apparatus, and more specifically to an RF pulse applying method and an MRI apparatus capable of receiving a signal of tissue long in T2 at a relatively high level and suppressing artifacts.

There has heretofore been known a pulse sequence of Balanced SSFP (Steady-State Free Precession) wherein a pulse train for increasing a flip angle is inserted before the application of an imaging pulse (refer to, for example, a patent document 1).

There has further been proposed a pulse sequence for suppressing artifacts at Balanced SSFP (refer to, for example, a non-patent document 1).

[Patent Document 1] Japanese Unexamined Patent Publication No. 2004-329268 (claim 1 and FIG. 3)

[Non-Patent Document 1] D. L. Foxall "Starter Sequence for Steady-State Free Precession Imaging" Magnetic Resonance in Medicine 53:919-929 (2005)

Generally, at Balanced SSFP, a signal of tissue long in T2 is relatively high in a state of transition (Transient State) to a Steady-state and becomes low in the Steady-state.

Since a transient state is long in the prior art described in the patent document 1, a signal of tissue long in T2 can be received at a relatively high level and contract can be kept high by performing data acquisition in the transient state.

However, a problem arises in that artifacts such as "Banding Artifact", etc. occur due to variations in the signal in the transient state.

On the other hand, the prior art described in the non-patent document 1 restricts variations in the signal in the transient state and suppresses the artifacts.

However, the present prior art is accompanied by problems that since the steady-state is formed quickly and the transient state is short, the signal of tissue long in T2 is hard to receive at a relatively high level and contract cannot be set high.

SUMMARY OF THE INVENTION

Therefore, an object of the present invention is to provide an RF pulse applying method and an MRI apparatus capable of receiving a signal of tissue long in T2 at a relatively high level and suppressing artifacts.

In a first aspect, the present invention provides an RF pulse applying method comprising the steps of applying a leading pulse for reducing a signal having components of frequencies $\Omega+\omega o$ and $\Omega-\omega o$ separated from each other by a frequency $\omega o$ corresponding to a repetition time TR when a magnetic resonance frequency of a component intended for measurement is assumed to be $\Omega$, and thereafter applying a pulse sequence of Balanced SSFP.

As a result of extensive investigations by the inventors of the present invention, the inventors have found out that the cause of occurrence of artifacts at Balanced SSFP resides in that when the frequency of a component intended for measurement is assumed to be $\Omega$, a signal having components of frequencies $\Omega+\omega o$ and $\Omega-\omega o$ separated from each other by a frequency $\omega o$ corresponding to a repetition time TR varies.

Therefore, in the RF pulse applying method according to the first aspect, a leading pulse for reducing a signal having components of frequencies $\Omega+\omega o$ and $\Omega-\omega o$ is applied prior to the pulse sequence of Balanced SSFP. Thus, since the signal leading to the occurrence of the artifacts becomes small, the artifacts can be suppressed. Since a transient state is long in the same manner as conventional, a signal of tissue long in T2 can be received at a relatively high level and contrast can be held high by performing data acquisition in the transient state.

In a second aspect, the present invention provides an RF pulse applying method wherein in the RF pulse applying method according to the first aspect, the leading pulse is an RF pulse obtained by modulating with cos ($\omega o \cdot t$), a chemical shift SAT pulse (Chemical Shift Saturation Pulse) for reducing a signal of a frequency $\Omega$.

Since the RF pulse obtained by modulating with cos ($\omega o \cdot t$), the chemical shift SAT pulse for reducing the signal of the frequency $\Omega$ is defined as the leading pulse in the RF pulse applying method according to the second aspect, the time required to apply the leading pulse can be rendered short.

Incidentally, the technique of applying the chemical shift SAT pulse has been described in, for example, Japanese Unexamined Patent Publication No. Hei 5 (1993)-64635.

In a third aspect, the present invention provides an RF pulse applying method wherein in the RF pulse applying method according to the first aspect, the leading pulse is a pulse train comprising two RF pulses corresponding to a chemical shift SAT pulse for reducing a signal having a component of a frequency $\Omega+\omega o$ and a chemical shift SAT pulse for reducing a signal having a component of a frequency $\Omega-\omega o$.

In the RF pulse applying method according to the third aspect, the chemical shift SAT pulse for reducing the signal having the component of the frequency $\Omega+\omega o$ and the chemical shift SAT pulse for reducing the signal having the component of the frequency $\Omega-\omega o$ are defined as the leading pulses. Therefore, the conventional algorithm for applying the chemical shift SAT pulse can be diverted.

In a fourth aspect, the present invention provides an RF pulse applying method wherein in the RF pulse applying method according to any of the first to third aspects, when the TR=5 ms, the $\omega o$=100 Hz.

As a result of extensive investigations by the inventors of the present invention, they found out that if $\omega o$=100 Hz where TR=5 ms, artifacts can be suppressed.

In a fifth aspect, the present invention provides an RF pulse applying method wherein in the RF pulse applying method according to any of the first to fourth aspects, the component intended for measurement is water.

In the RF pulse applying method according to the fifth aspect, a signal produced from the water can be received at a relatively high level and artifacts can be suppressed.

In a sixth aspect, the present invention provides an MRI apparatus comprising leading pulse applying means for applying a leading pulse, and imaging pulse applying means for applying a pulse sequence of Balanced SSFP, wherein the leading pulse applying means applies a leading pulse for reducing a signal having components of frequencies $\Omega+\omega o$ and $\Omega-\omega o$ separated from each other by a frequency $\omega o$ corresponding to a repetition time TR when a magnetic resonance frequency of a component intended for measurement is assumed to be $\Omega$.

In the MRI apparatus according to the sixth aspect, the RF pulse applying method according to the first aspect can suitably be carried out.

In a seventh aspect, the present invention provides an MRI apparatus wherein in the MRI apparatus according to the sixth aspect, the leading pulse is of an RF pulse obtained by modulating with cos ($\omega o \cdot t$), a chemical shift SAT pulse for reducing a signal of a frequency $\Omega$.

In the MRI apparatus according to the seventh aspect, the RF pulse applying method according to the second aspect can suitably be implemented.

In an eighth aspect, the present invention provides an MRI apparatus wherein in the MRI apparatus according to the sixth aspect, the leading pulse is of a pulse train comprising two RF pulses corresponding to a chemical shift SAT pulse for reducing a signal having a component of a frequency $\Omega+\omega o$ and a chemical shift SAT pulse for reducing a signal having a component of a frequency $\Omega-\omega o$.

In the MRI apparatus according to the eighth aspect, the RF pulse applying method according to the third aspect can suitably be performed.

In a ninth aspect, the present invention provides an MRI apparatus wherein in the MRI apparatus according to any of the sixth to eighth aspects, the $\omega o=100$ Hz when the TR=5 ms.

In the MRI apparatus according to the ninth aspect, the RF pulse applying method according to the fourth aspect can suitably be carried out.

In a tenth aspect, the present invention provides an MRI apparatus wherein in the MRI apparatus according to any of the sixth to ninth aspects, the component intended for measurement is water.

In the MRI apparatus according to the tenth aspect, the RF pulse applying method according to the fifth aspect can suitably be implemented.

According to the RF pulse applying method and MRI apparatus of the present invention, a signal of tissue long in T2 can be received at a relatively high level and artifacts can be suppressed.

The RF pulse applying method and MRI apparatus of the present invention can be used in imaging based on Balanced SSFP.

Further objects and advantages of the present invention will be apparent from the following description of the preferred embodiments of the invention as illustrated in the accompanying drawings.

DETAILED DESCRIPTION OF THE INVENTION

The present invention will hereinafter be described in further detail by embodiments illustrated in the figures. Incidentally, the present invention is not limited to or by the embodiments.

First Embodiment

Figure 1:
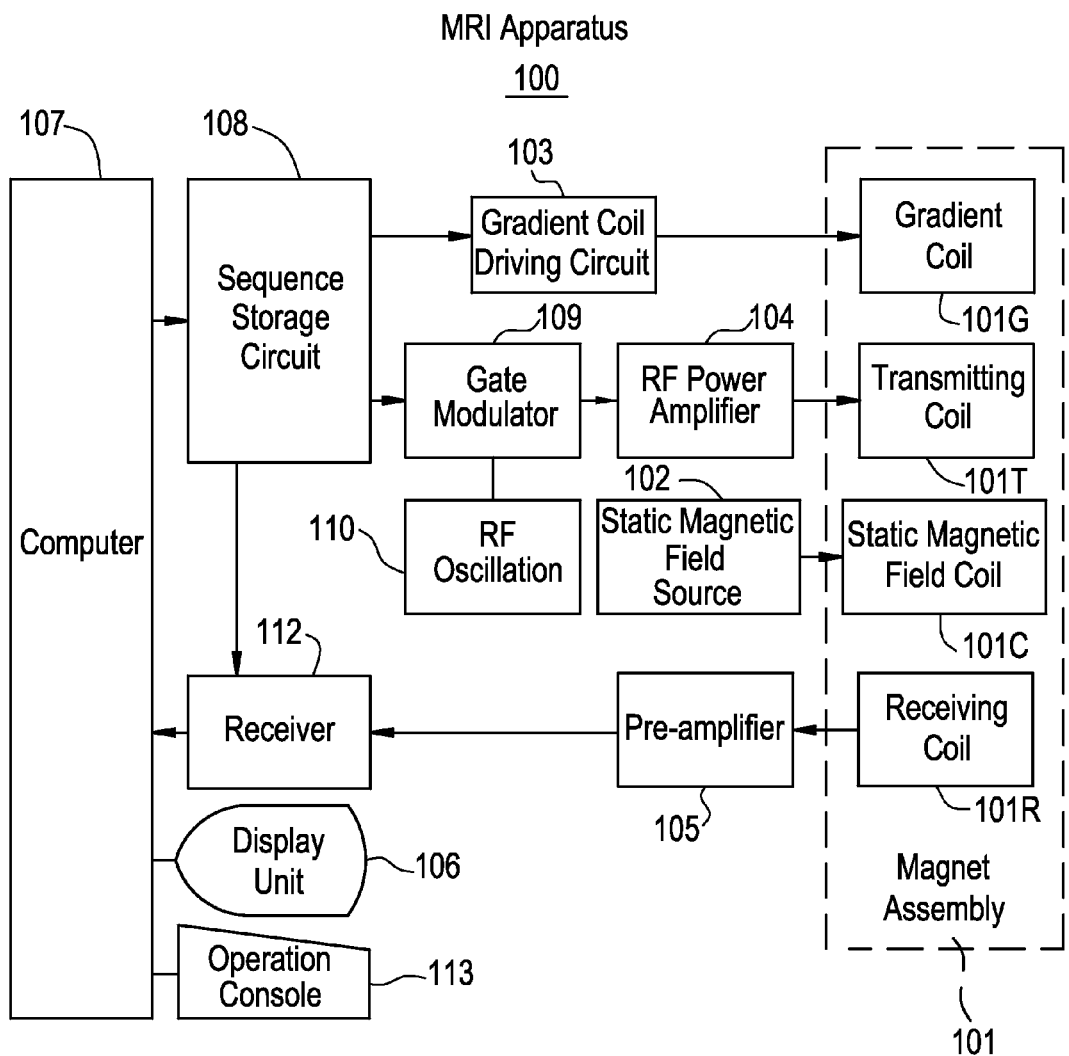
FIG. 1 is a block diagram showing a structure of an MIR apparatus according to a first embodiment.

FIG. 1 is a block diagram showing an MRI apparatus 100 according to a first embodiment.

In the present MRI apparatus 100, a magnet assembly 101 has a spatial portion (bore) for inserting a sample or subject thereinside. A static magnetic field coil 101C for applying a predetermined static magnetic field to the subject, a gradient coil 101G for generating gradient magnetic fields for an X axis, a Y axis and a Z axis, a transmitting coil 101T for supplying an RF pulse for exciting the spin of a nucleus in the subject, and a receiving coil 101R for receiving an NMR signal from the subject are disposed in the magnet assembly 101 so as to surround the spatial portion.

Now, the transmitting coil 101T and the receiving coil 101R might be both used as body coils. Alternatively, the transmitting coil 101T might be used as a body coil whereas the receiving coil 101R might be used as a surface coil.

The static magnetic field coil 101C is connected to a static magnetic field source 102. The gradient coil 101G is connected to a gradient coil driving circuit 103. The transmitting coil 101T is connected to an RF power amplifier 104. Further, the receiving coil 101R is connected to a pre-amplifier 105.

Incidentally, a permanent magnet may be used instead of the static magnetic field coil 101C.

A sequence storage circuit 108 controls or operates the gradient coil driving circuit 103, based on a pulse sequence stored therein in accordance with instructions given from a computer 107 to thereby generate a gradient magnetic field from the gradient coil 101G. Further, the sequence storage circuit 108 operates a gate modulator 109 to modulate a carrier output signal produced from an RF oscillator 110 to a pulsated signal represented in the form of a predetermined timing/predetermined envelope/predetermined phase and adds it to the RF power amplifier 104 as an RF pulse, where it is power-amplified. Thereafter, the RF power amplifier 104 applies the pulse to the transmitting coil 101T.

A receiver 112 converts the NMR signal to a digital signal and inputs it to the computer 107.

The computer 107 reads the digital signal from the receiver 112 and effects processing thereon to generate an MR image. Further, the computer 107 takes charge of the whole control such as the reception of information inputted from an operation console 113.

A display unit 106 displays an image and a message thereon.

Figure 2:
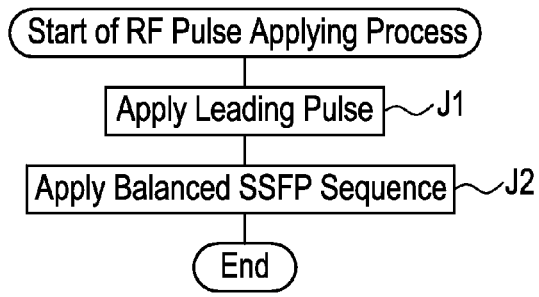
FIG. 2 is a flow chart showing an RF pulse applying process according to the first embodiment.

FIG. 2 is a flow chart showing an RF pulse applying process according to the first embodiment.

Figure 3:
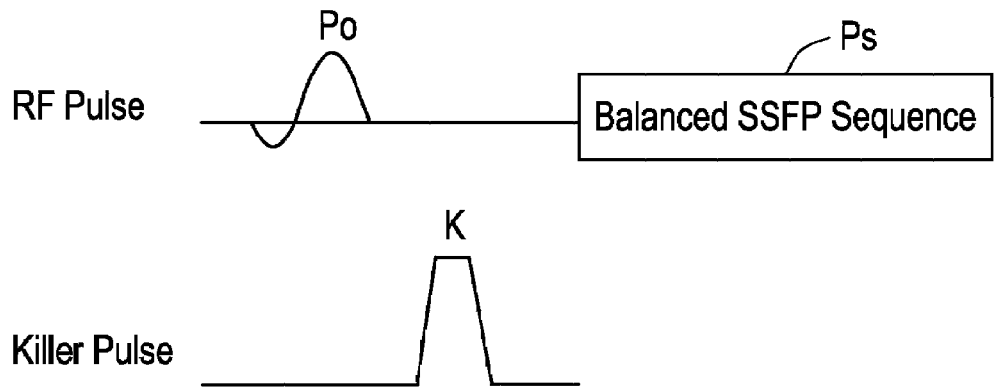
FIG. 3 is a timing chart showing a leading pulse and a Balanced SSFP sequence according to the first embodiment.

At Step J1, a leading pulse Po is applied as shown in FIG. 3.

The leading pulse Po shown in FIG. 3 is of an RF pulse obtained by modulating with cos ($\omega o \cdot t$), a chemical shift SAT pulse for reducing a signal of a frequency $\Omega$ when a magnetic resonance frequency of water corresponding to a component intended for measurement is assumed to be $\Omega$. When TR=5 ms, for example, $\omega o=100$ Hz.

Figure 4A:
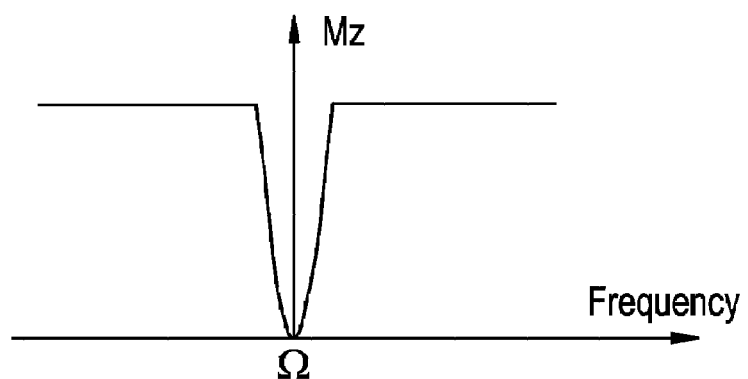
FIGS. 4a and 4b are frequency characteristic diagrams illustrating a signal strength suppression characteristic from vertical magnetization based on a chemical shift SAT pulse and a signal strength suppression characteristic from vertical magnetization based on a leading pulse according to the present invention.
Figure 4B:
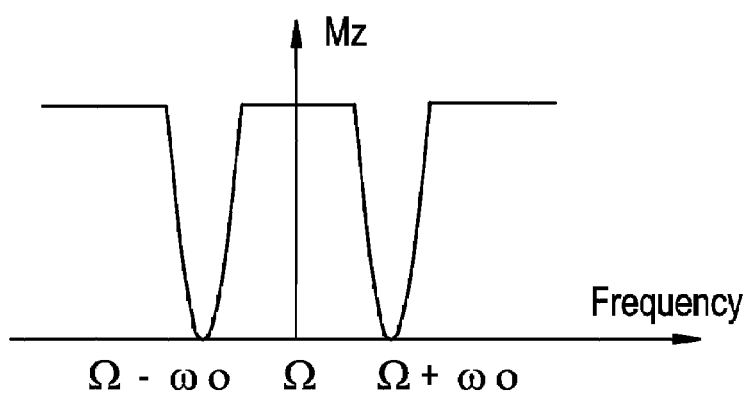

That is, while the chemical shift SAT pulse for reducing the signal of the frequency $\Omega$ is of an RF pulse for selectively bringing vertical magnetization Mz corresponding to the frequency $\Omega$ to approximately 0 as shown in FIG. 4(a), an RF pulse multiplied by cos ($\omega o \cdot t$) becomes an RF pulse for selectively bringing vertical magnetization Mz corresponding to frequencies $\Omega+\omega o$ and $\Omega-\omega o$ to approximately 0 as shown in FIG. 4(b).

Incidentally, a killer pulse K is applied onto an arbitrary axis after the leading pulse Po.

Referring back to FIG. 2, a pulse train Ps of a Balanced SSFP sequence is applied as shown in FIG. 3 at Step J2. Then imaging data are acquired. The pulse train Ps of the Balanced SSFP sequence is known.

According to the MRI apparatus 100 of the first embodiment, the following advantageous effects are obtained.

(1) Since a signal leading to the occurrence of artifacts is set small by applying the leading pulse Po for reducing the signal having the components of the frequencies $\Omega+\omega o$ and $\Omega-\omega o$ prior to the pulse sequence Ps of Balanced SSFP, the artifacts can be controlled.

(2) Since a transient state is long in the same manner as conventional, a signal of tissue long in T2 can be received at a relatively high level by performing data acquisition in the transient state, whereby contrast can be held high.

(3) The time required to apply the leading pulse Po is not taken long.

Second Embodiment

Figure 5:
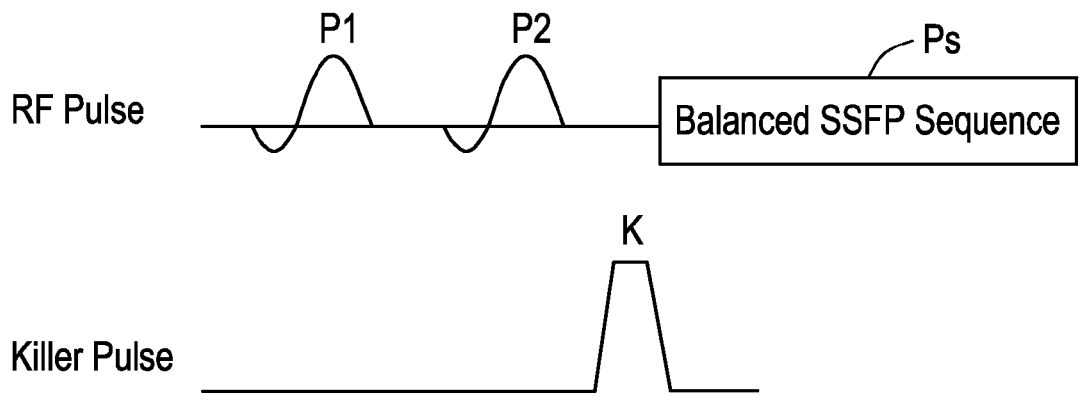
FIG. 5 is a timing chart showing leading pulses and a Balanced SSFP sequence according to a second embodiment.

Such leading pulses P1 and P2 as shown in FIG. 5 may be used.

Figure 6:
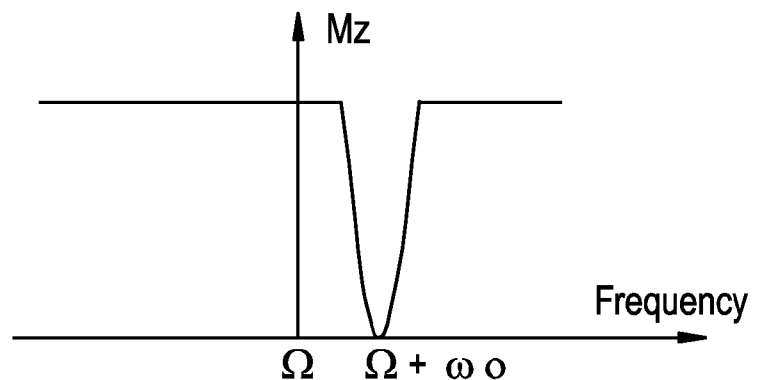
FIG. 6 is a frequency characteristic diagram illustrating a signal strength suppression characteristic from vertical magnetization based on a leading pulse according to the second embodiment.
Figure 7:
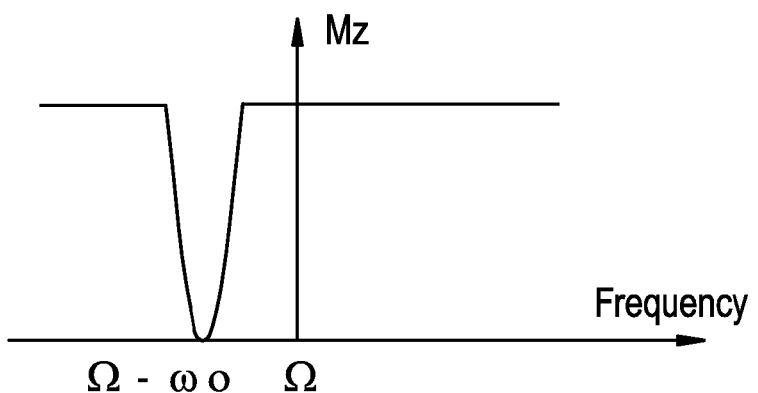
FIG. 7 is a frequency characteristic diagram showing a signal strength suppression characteristic from vertical magnetization based on a leading pulse according to the second embodiment.

The leading pulse P1 shown in FIG. 5 is of an RF pulse for selectively bringing vertical magnetization Mz corresponding to a frequency $\Omega+\omega o$ to approximately 0 as shown in FIG. 6. Further, the leading pulse P2 is of an RF pulse for selectively bringing vertical magnetization Mz corresponding to a frequency $\Omega-\omega o$ to approximately 0 as shown in FIG. 7.

Incidentally, a killer pulse K is applied onto an arbitrary axis after the leading pulses P1 and P2.

According to the MRI apparatus of the second embodiment, the following advantageous effects are obtained.

(1) Since a signal leading to the occurrence of artifacts is set small by applying the leading pulse P1 for reducing the signal having the component of the frequency $\Omega+\omega o$ and the leading pulse P2 for reducing the signal having the component of the frequency $\Omega-\omega o$ before the pulse sequence Ps of Balanced SSFP, the artifacts can be controlled.

(2) Since a transient state is long in the same manner as conventional, a signal of tissue long in T2 can be received at a relatively high level by performing data acquisition in the transient state, whereby contrast can be held high.

(3) A conventional algorithm for applying a chemical shift SAT pulse is available.

Many widely different embodiments of the invention may be configured without departing from the spirit and the scope of the present invention. It should be understood that the present invention is not limited to the specific embodiments described in the specification, except as defined in the appended claims.

The invention claimed is:

1. A radio frequency (RF) pulse applying method in order to acquire magnetic resonance (MR) data, said method comprising:

applying a leading pulse for reducing a vertical magnetization of a signal at at least one of a frequency $\Omega+\omega o$ and a frequency $\Omega-\omega o$, the signal having components at the frequencies $\Omega+\omega o$ and $\Omega-\omega o$ separated from each other by a frequency $\omega o$, wherein $\Omega$ is a magnetic resonance frequency of a component intended for measurement and $\omega o$ is a repetition time TR when the magnetic resonance frequency of the component intended for measurement is $\Omega$;

applying a pulse sequence of Balanced steady-state free precession (SSFP) after the leading pulse has been applied in order to reduce the vertical magnetization of the signal;

acquiring the MR data after applying the leading pulse; and outputting an MR image using the MR data.

2. The RF pulse applying method according to claim 1, wherein the leading pulse is an RF pulse obtained by modulating a chemical shift saturation (SAT) pulse with cos ($\omega o \cdot t$) in order to reduce a signal at a frequency $\Omega$.

3. The RF pulse applying method according to claim 1, wherein the leading pulse is a pulse train comprising:

a first RF pulse corresponding to a chemical shift SAT pulse that reduces a vertical magnetization of a signal having a component at the frequency $\Omega+\omega o$; and a second RF pulse corresponding to a chemical shift SAT pulse that reduces a vertical magnetization of a signal having a component at the frequency $\Omega-\omega o$.

4. The RF pulse applying method according to claim 1, wherein when said TR=5 ms, said $\omega o=100$ Hz.

5. The RF pulse applying method according to claim 1, wherein the component intended for measurement is water.

6. A magnetic resonance imaging (MRI apparatus comprising:

a leading pulse applying device that applies a leading pulse; and an imaging pulse applying device that applies a pulse sequence of Balanced steady-state free precession (SSFP) after the leading pulse has been applied, wherein the leading pulse applying device applies a leading pulse that reduces a vertical magnetization of a signal at least one of a frequency $\Omega+\omega o$ and a frequency $\Omega-\omega o$, the signal having components at the frequencies $\Omega+\omega o$ and $\Omega-\omega o$ separated from each other by a frequency $\omega o$, where $\Omega$ is a magnetic resonance frequency of a component intended for measurement and $\omega o$ is a repetition time TR when the magnetic resonance frequency of the component intended for measurement is $\Omega$, said MRI apparatus configured to:

acquire the MR data after applying the leading pulse; and output an MR image using the MR data.

7. The MRI apparatus according to claim 6, wherein the leading pulse is an RF pulse obtained by modulating a chemical shift saturation (SAT) pulse with cos ($\omega o \cdot t$) in order to reduce a vertical magnetization of a signal at a frequency $\Omega$.

8. The MRI apparatus according to claim 6, wherein the leading pulse is a pulse train comprising:

a first RF pulse corresponding to a chemical shift SAT pulse that reduces a vertical magnetization of a signal having a component at the frequency $\Omega+\omega o$; and a second RF pulse corresponding to a chemical shift SAT pulse that reduces a vertical magnetization of a signal having a component at the frequency $\Omega-\omega o$.

9. The MRI apparatus according to claim 6, wherein when said TR=5 ms, said $\omega o=100$ Hz.

10. The MRI apparatus according to claim 6, wherein the component intended for measurement is water.

11. A method for applying a radio frequency pulse in order to acquire magnetic resonance (MR) image data, said method comprising:

applying a leading pulse in order to reduce a vertical magnetization of a signal at at least one of a frequency greater than a frequency $\Omega$ and a frequency less than the frequency $\Omega$, the signal having the frequency $\Omega$ that is the same as a magnetic resonance frequency $\Omega$ of a component intended for measurement;

applying a pulse sequence of Balanced steady-state free procession (SSFP) after reducing the vertical magnetization of the signal having the frequency $\Omega$ by applying the leading pulse;

acquiring the MR image data after applying, the leading pulse; and outputting an MR image using the MR image data.

12. The method according to claim 11, further comprising obtaining the leading pulse by modulating a chemical shift saturation (SAT) pulse in order to reduce the vertical magnetization of the signal having the frequency $\Omega$.

13. The method according to claim 11, further comprising applying the leading pulse as a pulse train having two RF pulses.

14. The method according to claim 13, wherein applying the leading pulse as a pulse train having two RF pulses further comprises:

applying a first RF pulse that corresponds to a chemical shift SAT pulse that reduces a vertical magnetization of a signal having the frequency greater than the frequency $\Omega$; and applying a second RF pulse that corresponds to a chemical shift SAT pulse that reduces a vertical magnetization of a signal having the frequency less than the frequency $\Omega$.

15. The method according to claim 11, wherein applying a leading pulse further comprises applying a leading pulse that includes components having frequencies that are separated from each other by a frequency that corresponds to a repetition time.

16. The method according to claim 11, wherein applying a leading pulse in order to reduce a vertical magnetization of a signal further comprises applying a leading pulse in order to reduce the vertical magnetization of the signal having the frequency $\Omega$, where $\Omega$ is a magnetic resonance frequency of water.

17. The method according to claim 11, further comprising applying a killer pulse after the leading pulse and before the pulse sequence.

18. The method according to claim 11, wherein applying a leading pulse further comprises applying a leading pulse in order to facilitate reducing artifacts in an image.

19. The method according to claim 11, further comprising:
acquiring the MR image data during the pulse sequence; and
generating the MR image based on the acquired MR image data.

20. The method according to claim 12, wherein obtaining the leading pulse by modulating a chemical shift SAT pulse further comprises obtaining the leading pulse by modulating the chemical shift SAT pulse with cos ($\omega_0 \cdot t$), wherein $\omega_0$ is a frequency corresponding to a repetition time.

* * * * *